United States Patent [19]

Niemann et al.

[11] Patent Number: 5,122,249
[45] Date of Patent: Jun. 16, 1992

[54] METHOD OF PRODUCING A COVER LAYER OF AMORPHOUS CARBON ON A SUBSTRATE

[75] Inventors: Ekkehard Niemann, Maintal; Roland Herkert, Frankfurt am Main, both of Fed. Rep. of Germany

[73] Assignee: Licentia Patent-Verwaltungs-GmbH, Frankfurt am Main, Fed. Rep. of Germany

[21] Appl. No.: 372,182

[22] Filed: Jun. 26, 1989

[30] Foreign Application Priority Data

Jun. 27, 1988 [DE] Fed. Rep. of Germany ....... 3821614

[51] Int. Cl.⁵ .................. C23C 14/06; C23C 14/38
[52] U.S. Cl. ................. 204/192.16; 204/192.15; 204/192.22; 204/192.26
[58] Field of Search .............. 204/192.12, 192.15, 204/192.16, 192.22, 192.25, 192.26

[56] References Cited

U.S. PATENT DOCUMENTS

| 4,094,763 | 6/1978 | Gillery et al. ............... 204/192.29 |
| 4,612,100 | 9/1986 | Edeling et al. ............... 204/192.15 |
| 4,778,582 | 10/1988 | Howard ....................... 204/192.15 |
| 4,877,677 | 10/1989 | Hirochi ........................... 428/216 |

FOREIGN PATENT DOCUMENTS

| 0102328 | 3/1984 | European Pat. Off. . |
| 0155178 | 9/1985 | European Pat. Off. . |
| 0231894 | 8/1987 | European Pat. Off. . |

OTHER PUBLICATIONS

Wada et al "DiamondLike 3-fold Coordinated Amorphous Carbon" Journal of Non-Crystalline Solids, 35 & 36 (1980) pp. 543, 548.

K. Y. Ahn et al, Barrier Layer . . . , IBM Technical Disclosure Bulletin, vol. 17, No. 8, Jan. 1975, pp. 2475.

S. Yamada, A Review of Glasslike Carbons, Defense Ceramic Information Center, Battelle Memorial Institute, Columbus, OH, Apr., 1968, pp. 1-2.

L. H. Edelson et al, Method for Removing Surface Porosity on Glassy Carbon Tiles, Carbon, vol. 24, pp. 635.

Stuart, Vacuum Technology, Thin Films and Sputtering, Academic Press, New York, 1983, pp. 123-131.

Brian Chapman, Glow Discharge Processes, John Wiley & Sons, New York, 1980, pp. 260-276.

John L. Vossen et al, Thin Film Processes, Academic Press, 1978, pp. 46-50, 526-527.

Primary Examiner—John Niebling
Assistant Examiner—William T. Leader
Attorney, Agent, or Firm—Spencer, Frank & Schneider

[57] ABSTRACT

A method of providing an amorphous carbon cover layer on an electrophotographic recording material, including the steps of (a) providing a substrate which is an electrophotographic recording material, (b) maintaining the substrate in an atmosphere comprised of argon, hydrogen, and $C_2F_6$, and (c) simultaneously with step (b), depositing amorphous fluorinated, hydrogenated carbon on the substrate by direct current magnetron cathode sputtering of glasslike carbon to provide an amorphous carbon cover layer which is transparent, hydrophobic, and has a Vickers hardness of greater than 2000.

11 Claims, 1 Drawing Sheet

METHOD OF PRODUCING A COVER LAYER OF AMORPHOUS CARBON ON A SUBSTRATE

BACKGROUND OF THE INVENTION

1. Field of the Invention

The present invention relates to a method of producing a cover layer of amorphous carbon, which contains hydrogen and/or fluorine as an additional element, on a substrate. The invention also relates to a cover layer produced according to such a method.

2. Discussion of the Background

Cover layers of hydrogenated amorphous carbon (a—C:H) are used because of their great hardness. It is known to produce such cover layers by glow discharge at high frequencies from an acetylene gas atmosphere in conjunction with argon. Due to the low deposition rate, the production of cover layers according to this method is complicated, time consuming and expensive.

It has also been attempted to produce layers of amorphous carbon by means of direct current cathode sputtering using graphite as the target. The latter method is performed with aperture (diaphragm) systems (Journal of Non-Crystalline Solids 35 & 36 (1980), North Holland Publishing Company, pages 543–548).

SUMMARY OF THE INVENTION

It is an object of the present invention to develop a method of depositing cover layers of amorphous carbon on substrates faster and more economically than it has been feasible theretofore.

This is accomplished by the present invention by direct current magnetron cathode sputtering using a glass-like carbon target (or glassy carbon target) argon-hydrogen or argon-hydrogen-fluorocarbon atmosphere.

The method according to the invention permits the production of a transparent cover layer which has great hardness and low specific conductivity. Moreover, the layer is hydrophobic and resistant to alkaline solutions and to acids. At the appropriate power levels, the dc-magnetron process permits high deposition rates allowing the cover layers, preferably in a $\mu$m thickness range, to be deposited quickly on the substrate.

As the target preferably glass-like carbon is employed whose microporosity, gas impermeability and hardness are approximately the same as those of glass. With glass-like carbon, cover layers can be produced which have very favorable characteristics. The purity of this material is very high compared to graphite. In particular, because of its low porosity (0 %), this material is better suited than graphite (porosity 20 %) for use in vacuum systems.

A cover layer according to the present invention is transparent, hydrophobic and has an electrical conductivity of about $10^{-12} \Omega^{-1} cm^{-1}$. The optical band gap of the cover layer is greater than 2.7 eV. The cover layer has a Vickers hardness of 2000 or more.

A cover layer of the above described type can be employed on an electrophotographic recording material which may have an amorphous silicon layer as its carrier substance. Moreover, a cover layer of the above-described type can advantageously be applied to printed circuit boards to electrically insulate and protect them, and may also be applied to other carriers, for example, to image carriers and metals.

DETAILED DESCRIPTION OF THE PREFERRED EMBODIMENTS

Figure 1:
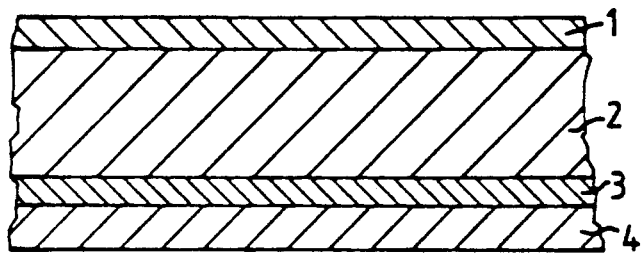
FIG. 1 is a cross-sectional view of an electrophotographic image carrier provided with a cover layer of amorphous carbon.

A cover layer 1 of amorphous carbon a-C:H which contains hydrogen and/or fluorine as additional element is produced on a substrate 2 in the manner to be described below. The term substrate, as used here, means a carrier material to which the cover layer can adhere. The substrate is, preferably, silicon (for example, the amorphous silicon of an electrophotographic recording material). Substrate 2 is disposed on a barrier layer 3 which is disposed on an aluminum carrier 4.

Cover layer 1 is produced on substrate 2 by direct current magnetron cathode sputtering. Glass-like coal is provided as the target.

The magnetron cathode sputtering can be produced in an argon-hydrogen atmosphere at a substrate temperature of room temperature to about 500° C. The power density may be set between 1 W/cm$^2$ and up to 1000 W/cm$^2$. The hydrogen influx, which is regulated by way of flow meters, preferably lies between 1 and 200 sccm. At about 10 sccm, deposition rates of about 0.5 $\mu$m/h can be realized.

Amorphous carbon can also be produced on substrate 2 by direct current magnetron cathode sputtering in an argonhydrogen-fluorocarbon atmosphere. The fluorocarbon employed is, in particular, the gaseous, non-toxic $C_2F_6$. However, $CF_4$ or $C_2F_4$ may also be employed. The amorphous carbon layer containing fluorine (a—C:H:F) promises an even greater mechanical hardness since the C—F bond is stronger than the C—H bond.

Glass-like carbon is a type of carbon which in many characteristics is similar to glass. Glass-like carbon has a closed microporosity, is impermeable to gas and has a hardness corresponding to glass. Preferably, a glass-like carbon is employed whose apparent specific weight is in a range from 1.5 to 1.55 g/cm$^3$ and whose open porosity is 0 %. Its gas permeability at room temperature is preferably $<10^{-8}$ and its ash content is less than 400 ppm. The sulfur content of the glass-like carbon is about 50 ppm. The glasslike carbon may have a boron content of 2 ppm. The bending strength of the glass-like carbon is in a range from 600 to 1000 deca N/cm$^2$ (1 deca N/cm$^2$ = 1 bar). Its crushing strength should be in a range from 1500 to 3000 deca N/cm$^2$. A glass-like carbon can be employed which has a Shore hardness of 120 to 125 and a Vickers microhardness at 0.3 N of 150 to 225. The coefficient of thermal expansion is $3.2 \times 10^{-6}$ per ° C. at 100° C. and $3.5 \times 10^{-6}$ per ° C. at 600° C. The thermal conductivity may be, for example, in a range from 4 to 8 W per m° C. The specific electrical resistance lies in a range from 45 to $55 \times 10^{-4} \Omega$ cm.

In the manufacture of the layer of amorphous carbon, an argon-hydrogen atmosphere or an argon-hydrogen-fluorocarbon atmosphere of $9.5 \times 10^{-3}$ mbar pressure was set. The direct current power was 60 W. A layer was produced which had a band gap of 2.7 eV. The layer had a Vickers hardness of more than 2000. IR absorption measurements revealed CH vibration bands in the amorphous carbon. According to an X-ray structure analysis, the cover layer was amorphous. The refractive index of the layer lay in a range from 2.0 to 2.4 for a light wavelength of 633 nm while diamond has an index of 2.43, according to Landoldt-Bernstein "Optische Konstanten" [Optical Constants]).

Figure 2:
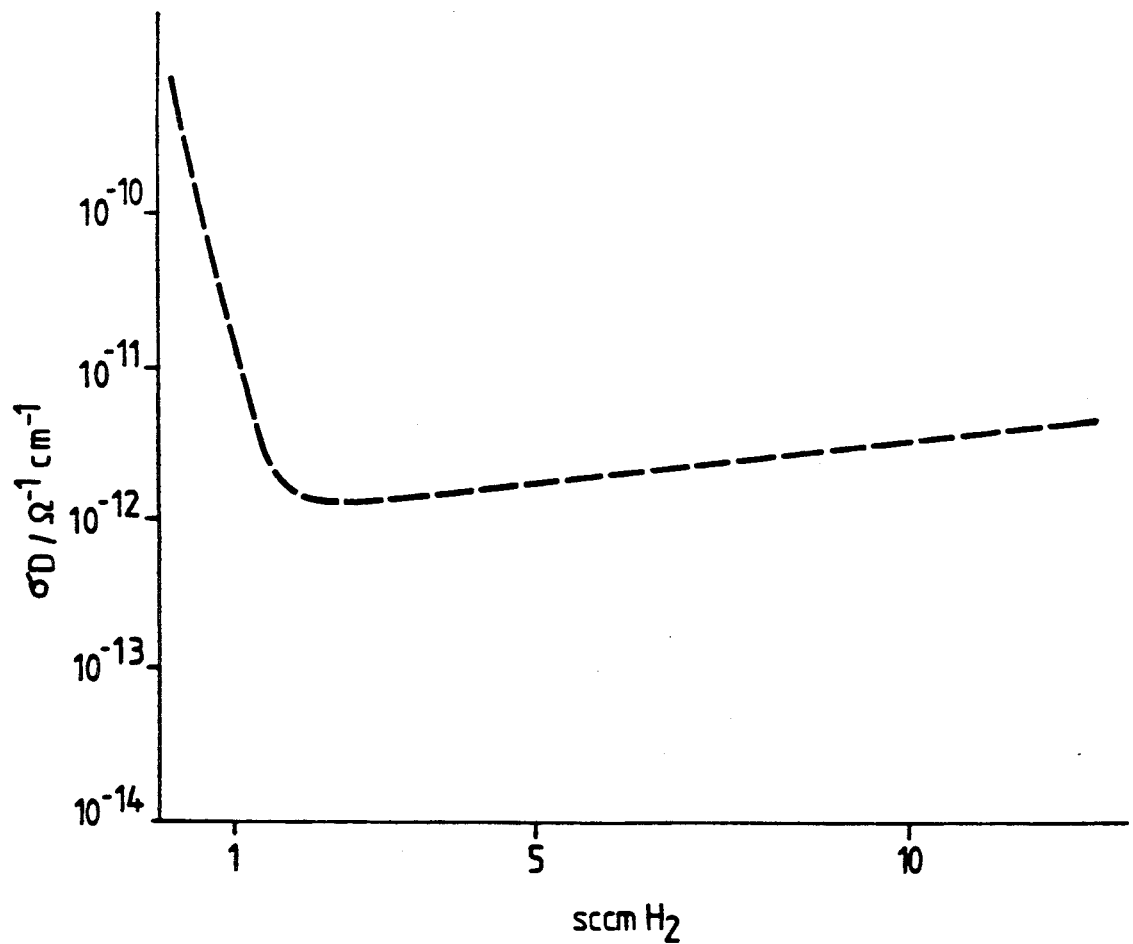
FIG. 2 is a graph of the conductivity of a cover layer as a function of the influx of hydrogen during deposition of the cover layer.

FIG. 2 shows the specific conductivity of the cover layer 1 as a function of the hydrogen influx. As seen from the graph, a hydrogen influx in a range from 1 sccm to 10 sccm, results in a specific conductivity of about $10^{-12}\Omega^{-1}cm^{-1}$. This value is a very low specific conductivity which practically corresponds to that of a good insulator. The cover layer produced in the above-described manner is transparent, hydrophobic, and resistant to alkaline solutions and to acids. Moreover, the cover layer is very hard and almost reaches the hardness of diamond. Cover layers of a thickness up to 10 μm can be produced in a short time. The deposition rate is a function of the power; thus, for example, a deposition rate of 0.5 μm/h can be realized with a d.c. power of about 1 W/cm². Very high deposition rates can be realized with direct current powers of 200 W and higher, even in the kilowatt range.

For materials, such as selenium, whose properties are harmed at higher temperatures, substrate temperatures of 50° C. may be selected. For relatively heat resistant materials, temperatures up to 400° C. may be selected.

Doping gases may be added to the argon-hydrogen atmosphere or the argon-hydrogen-fluorocarbon atmosphere to produce n-conductive material or p-conductive material. A suitable doping gas for n-conductive material is phosphine ($PH_3$). For p-conductive material, diborane ($B_2H_6$) or trimethyl gallium ($Ga(CH_3)_3$) is suitable.

Due to their many superior characteristics, the cover layers produced in the above-described manner are suitable for protecting numerous materials. One possible use is the covering of an electrophotographic recording material which may be selenium or silicon based. Another possible use is the coating of printed circuit boards, to insulate the printed circuit boards and protect them mechanically. Moreover, image carriers and metals may be coated. The cover layers may also be used for the production of antireflective coatings, for example on photodiodes.

It will be understood that the above description of the present invention is susceptible to various modifications, changes and adaptations, and the same are intended to be comprehended within the meaning and range of equivalents of the appended claims.

We claim:

1. A method of providing an amorphous carbon cover layer on an electrophotographic recording material, comprising the steps of:
   (a) providing a substrate which is an electrophotograhpic recording material;
   (b) maintaining the substrate in an atmosphere comprised of argon, hydrogen, and $C_2F_6$; and
   (c) simultaneously with step (b), depositing amorphous fluorinated, hydrogenated carbon on the substrate by direct current magnetron cathode sputtering of glass-like carbon to provide an amorphous carbon cover layer which is transparent, hydrophobic, and has a Vickers hardness of greater than 2000.

2. The method as defined in claim 1, wherein the glass-like carbon has an apparent specific weight of 1.5 to 1.55 g/cm³ and a porosity of about 0%.

3. The method as defined in claim 1, wherein the glass-like carbon has an ash content of less than 400 ppm, a sulfur content of not more than about 50 ppm, and a boron content of not more than about 2 ppm.

4. The method as defined in claim 1, wherein the glass-like carbon has a bending strength ranging from 600 to 1000 deca N/cm², a crushing strength ranging from 1500 to 3000 deca N/cm², a Shore hardness ranging from 120 to 125 and a Vickers microhardness at 0.3 N ranging from 150 to 225.

5. The method as defined in claim 1, wherein the glass-like carbon has a coefficient of thermal expansion of about $3.2 \times 10^{-6}$ per ° C. at 100° C.

6. The method as defined in claim 1, wherein the glass-like carbon has a specific electrical conductivity ranging from $2.2 \times 10^2 \Omega^{-1} cm^{-1}$ to $1.8 \times 10^2 \Omega^{-1} cm^{-1}$.

7. The method as defined in claim 1, wherein said atmosphere further comprises doping gas.

8. The method as defined in claim 7, wherein the doping gas is phosphine ($PH_3$), whereby the cover layer is an n-conductive material.

9. The method as defined in claim 7, wherein the doping gas is selected from the group consisting of diborane ($B_2H_6$) and trimethyl gallium ($Ga(CH_3)_3$), whereby the cover layer is a p-conductive material.

10. The method as defined in claim 1, wherein the step of maintaining the substrate in an atmosphere, step (b), includes providing a hydrogen influx rate of at least 1 sccm.

11. The method as defined in claim 1, wherein the electrophotographic recording material is comprised of a substance selected from the group consisting of silicon and selenium.

* * * * *